(12) United States Patent
Soda

(10) Patent No.: US 7,711,019 B2
(45) Date of Patent: May 4, 2010

(54) VARIABLE WAVELENGTH LIGHT SOURCE

(75) Inventor: Haruhisa Soda, Tokyo (JP)

(73) Assignee: FiBest Limited, Hachioji (JP)

( * ) Notice: Subject to any disclaimer, the term of this patent is extended or adjusted under 35 U.S.C. 154(b) by 0 days.

(21) Appl. No.: 12/028,311

(22) Filed: Feb. 8, 2008

(65) Prior Publication Data
US 2008/0212622 A1 Sep. 4, 2008

(30) Foreign Application Priority Data
Feb. 9, 2007 (JP) .............................. 2007-030752

(51) Int. Cl.
*H01S 3/13* (2006.01)
(52) U.S. Cl. ............................. 372/32; 372/18; 372/20; 372/28; 372/29.016; 372/29.023
(58) Field of Classification Search .................. 372/20, 372/28, 29.016, 29.023, 32
See application file for complete search history.

(56) References Cited
U.S. PATENT DOCUMENTS
2002/0172239 A1  11/2002  McDonald et al.
2005/0094680 A1*  5/2005  Takabayashi et al. ......... 372/20
2007/0268568 A1*  11/2007  Higashi et al. .............. 359/333

FOREIGN PATENT DOCUMENTS
JP       2004-191729         7/2004
WO    WO 2005/041372 A1   5/2005

* cited by examiner

*Primary Examiner*—Tod T Van Roy
(74) *Attorney, Agent, or Firm*—Oblon, Spivak, McClelland, Maier & Neustadt, L.L.P.

(57) ABSTRACT

A gain element and a variable wavelength reflector form a resonator. A wavelength selective element selects a resonance wavelength in the resonator. A beam splitter is provided for monitoring an incident light from the gain element and a reflected light from the variable wavelength reflector. A phase adjustment element is arranged in the resonator. A wavelength-lock control unit locks the resonance wavelength to a desired resonance wavelength by adjusting the phase of the resonance wavelength based on the monitored incident light and by adjusting the variable wavelength reflector based on a ratio between the incident light and the reflected light.

10 Claims, 18 Drawing Sheets

VARIABLE WAVELENGTH LIGHT SOURCE

CROSS-REFERENCE TO RELATED APPLICATIONS

The present application claims priority to and incorporates by reference the entire contents of Japanese priority document 2007-30752 filed in Japan on Feb. 9, 2007.

BACKGROUND OF THE INVENTION

1. Field of the Invention

The present invention relates to a variable wavelength light source capable of locking a variable resonance wavelength.

2. Description of the Related Art

Various variable wavelength light sources that output variable-wavelength laser lights have been known. Specifically, there is provided a variable wavelength light source configured to output a laser light with a desired resonance wavelength by using only a single gain element and elements arranged outside the gain element to provide a function of locking a variable wavelength (see Patent Document 1 (WO/2005/041372), Patent Document 2 (US Patent 2002/0172239)). The Patent Document 1 discloses a technology for locking a wavelength at a desired resonance wavelength by selecting a wavelength using a variable wavelength mirror and performing a phase adjustment by controlling an electric current applied to the gain element. The Patent Document 2 discloses a technology for locking a wavelength at a desired resonance wavelength without using a wavelength selective element such as an etalon in a resonator. Patent Document 3 (Japanese Patent Application Laid-open No. 2004-191729) discloses a technology for suppressing a liquid-crystal driving voltage to below 10 volts by arranging a transparent electrode in an etalon cavity of a tunable liquid-crystal etalon filter.

However, the variable wavelength light sources described above are configured to perform both a power control of the gain element and a phase adjustment of the resonance wavelength by a current control. Therefore, the power control and the phase adjustment cannot be performed separately, resulting in making it difficult to perform wavelength-lock control in a precise manner. It is necessary to enhance the wavelength accuracy of a target wavelength by a wavelength selective element such as an etalon for selecting an exact wavelength in the variable wavelength light source.

SUMMARY OF THE INVENTION

The present invention has been achieved in consideration of the above aspects, and it is an object of the present invention to provide a variable wavelength light source capable of outputting a variable wavelength light with high precision with a simple structure.

A variable wavelength light source according to the present invention includes a gain element forming an output facet of a resonator, and a variable wavelength reflector forming a reflection facet of the resonator for selecting a desired resonance wavelength by changing its resonance wavelength, a wavelength selective element that selects the resonance wavelength in the resonator formed by the output facet and the reflection facet, a beam splitter for monitoring an incident light from the gain element and a reflected light from the variable wavelength reflector, a phase adjustment element that is arranged in the resonator and changes a phase of the resonance wavelength, and a wavelength-lock control unit that locks the resonance wavelength to the desired resonance wavelength by adjusting the phase of the resonance wavelength by the phase adjustment element based on the incident light monitored by the beam splitter and by changing the resonance wavelength by adjusting the variable wavelength reflector based on a ratio between the incident light and the reflected light.

Furthermore, the variable wavelength light source according to the present invention is characterized in that a total optical path of the gain element, a space between the gain element and the wavelength selective element, the wavelength selective element, and a space between the wavelength selective element and the variable wavelength reflector corresponds to an integral multiple of an optical path length of the wavelength selective element, the phase adjustment element is adjusted to a predetermined value corresponding to the resonance wavelength, and the wavelength-lock control unit locks the resonance wavelength to the desired resonance wavelength by exclusively adjusting the variable wavelength reflector based on the ratio between the incident light and the reflected light monitored by the beam splitter.

Moreover, the variable wavelength light source according to the present invention is characterized in that the phase adjustment element is integrated with the variable wavelength reflector.

Furthermore, the variable wavelength light source according to the present invention is characterized in that the phase adjustment element and the variable wavelength reflector have an optical waveguide structure.

Moreover, the variable wavelength light source according to the present invention is characterized in that the wavelength selective element and the variable wavelength reflector are etalons, the phase adjustment element is an optical phase shifter in which liquid crystal is filled between optical glass plates having transparent electrodes, the variable wavelength reflector has liquid crystal filled in an etalon cavity, and the wavelength-lock control unit changes an effective refractive index of the liquid crystal by changing alternating-current voltage applied to the liquid crystal.

Furthermore, the variable wavelength light source according to the present invention is characterized in that the wavelength-lock control unit locks the resonance wavelength to the desired resonance wavelength by repeating a phase adjustment by the phase adjustment element and a wavelength adjustment by the variable wavelength reflector.

Moreover, the variable wavelength light source according to the present invention is characterized in that the reflection facet side of the variable wavelength reflector has a retro reflector structure.

Furthermore, the variable wavelength light source according to the present invention is characterized in that the gain element includes an oblique output waveguide that obliquely outputs a light on the reflection facet side.

The above and other objects, features, and advantages of this invention will be better understood by reading the following detailed descriptions with the accompanying drawings.

DETAILED DESCRIPTION OF THE PREFERRED EMBODIMENTS

Figure 1:
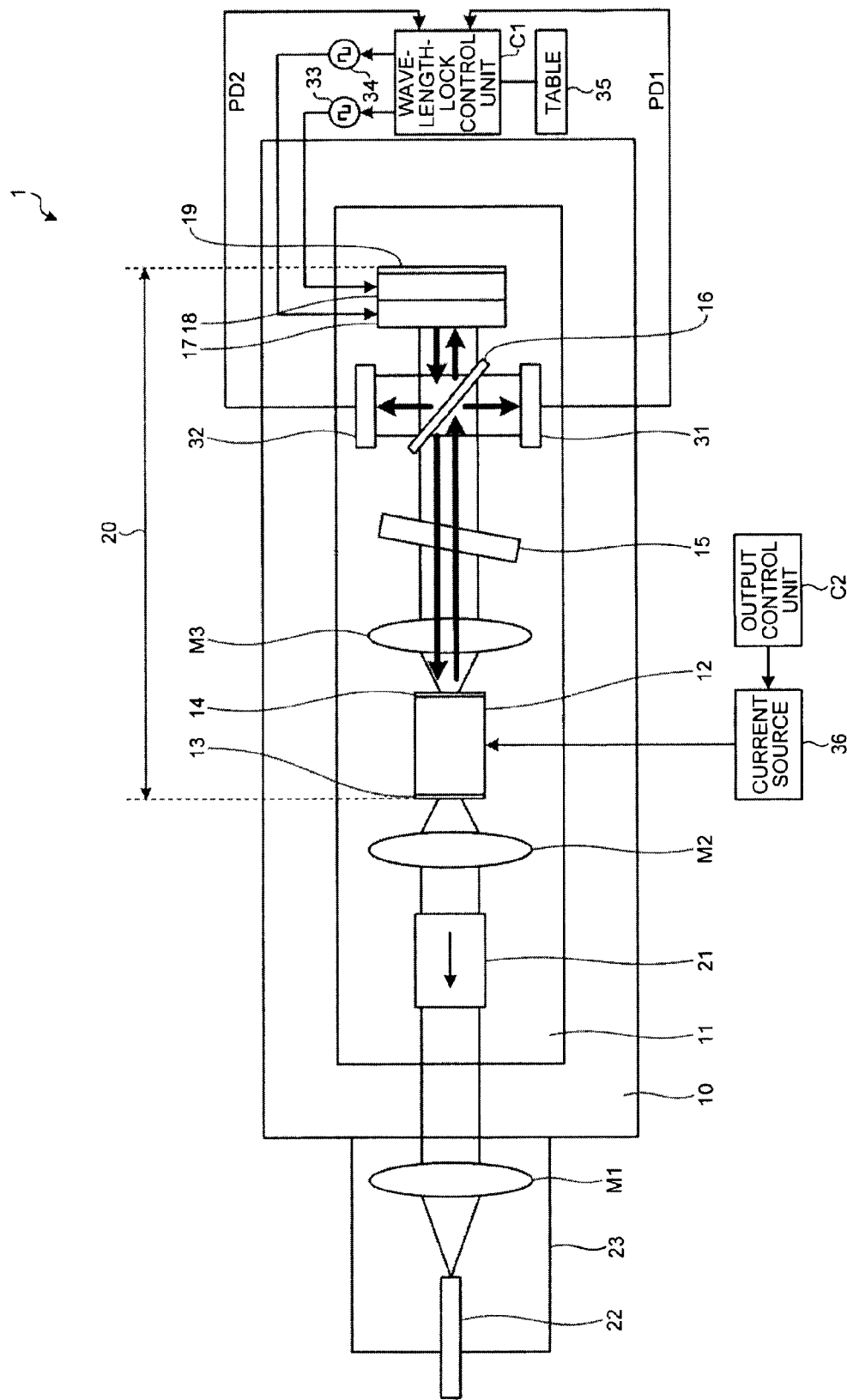
FIG. 1 is a schematic diagram of a variable wavelength light source according to a first embodiment of the present invention.

Exemplary embodiments of a variable wavelength light source of the present invention are explained in detail below with reference to the accompanying drawings. The present invention is not limited to the below embodiments. Same reference numerals are assigned to the same and equivalent constituent elements in the drawings.

First Embodiment

FIG. 1 is a schematic diagram of a variable wavelength light source according to a first embodiment of the present invention. As shown in FIG. 1, a variable wavelength light source 1 includes a gain element 12 that is arranged on a thermoelectric cooler (TEC) 11 in a package 10 covering the variable wavelength light source 1, and generates a light and amplifies a generated light. A coupling lens M3, an etalon 15, a beam splitter 16, a phase adjustment element 17, and a variable wavelength reflector 18 are aligned in that order on the rear stage of the gain element 12. When the light is obliquely emitted from the rear facet of the gain element 12, constituent elements on the rear stage of the gain element 12 need to be arranged in a curved manner. Alternatively, it is possible to insert a prism that changes an optical path to compensate for a curved arrangement.

The gain element 12 includes a low-reflection mirror 13 on a front (output) facet and an antireflection (AR) coating 14 on a rear (reflection) facet. A high-reflection (HR) coating 19 is arranged on a rear facet of the variable wavelength reflector 18. The coupling lens M3 outputs a light emitted from the gain element 12 toward the variable wavelength reflector 18 as a collimated light. The etalon 15 is a Fabry-Perot etalon serving as a wavelength filter that selectively transmits only a desired periodic resonance wavelength within a narrow wavelength range. The beam splitter 16 reflects a part of the light emitted from the gain element 12 toward a photodetecting element 31, and reflects a part of the light reflected by the variable wavelength reflector 18 toward a photodetecting element 32. The phase adjustment element 17 and the variable wavelength reflector 18 are integrated and serve as a bulk-type filter in which liquid crystal is filled between transparent electrodes of each of the phase adjustment element 17 and the variable wavelength reflector 18. With this configuration, a refractive index of each liquid crystal can be changed by changing alternating current (AC) voltage applied to the liquid crystal, and therefore, the phase adjustment element 17 performs a phase adjustment by changing an optical path length, and the variable wavelength reflector 18 performs a wavelength adjustment for changing a transparent wavelength (see Patent document 3). The transparent wavelength range of the variable wavelength reflector 18 is broad enough to cover a wavelength selection range of the etalon 15. The phase adjustment element 17 and the variable wavelength reflector 18 can share a transparent electrode. For example, a transparent electrode on the ground side can be shared.

Constituent elements from the low-reflection mirror 13 of the gain element 12 to the HR coating 19 serve as a laser resonator 20. A laser light with a desired resonance wavelength oscillated by the laser resonator 20 is output from the low-reflection mirror 13 to a collimating lens M2 that converts an output laser light into a collimated light. The collimated light is input to an isolator 21. The focusing lens M1 condenses the laser light output from the isolator 21 on a facet of a polarization-maintaining optical fiber 22. The collimating lens M2 and the isolator 21 are arranged on the TEC 11, while the focusing lens M1 and the facet of the polarization-maintaining optical fiber 22 are arranged in a holding unit 23 arranged outside the package 10. The isolator 21 can also be arranged on a position between the focusing lens M1 and the polarization-maintaining optical fiber 22 outside the package 10.

As described above, the photodetecting element 31 that detects a light incident from the gain element 12, and the photodetecting element 32 that detects a light reflected by the variable wavelength reflector 18 are arranged near the beam splitter 16. A wavelength-lock control unit C1 arranged outside the package 10 controls, based on detected-light intensities PD1 and PD2 respectively input from the photodetecting elements 31 and 32, AC voltage to be applied by an AC voltage source 34 to cause the phase adjustment element 17 to perform the phase adjustment control and to cause the variable wavelength reflector 18 to perform the wavelength adjustment. An initial AC voltage to be input to the phase adjustment element 17 and the variable wavelength reflector 18 is determined based on a relation between a resonance wavelength and an applied AC voltage stored in a table 35.

On the other hand, an electric current is applied to the gain element 12 from a current source 36, and an output control unit C2 controls electric current to perform a power control on the laser light output from the variable wavelength light source 1.

Figure 2:
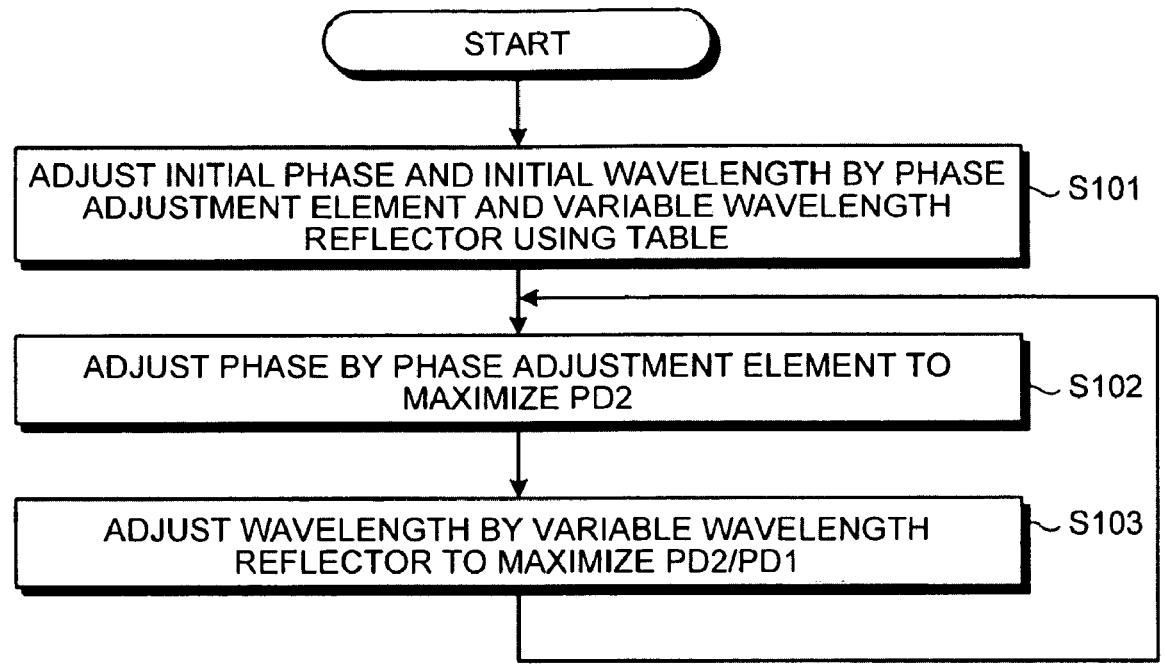
FIG. 2 is a flowchart of a wavelength-lock control process performed by a wavelength-lock control unit of the variable wavelength light source shown in FIG. 1.

A resonance-wavelength-lock process performed by the wavelength-lock control unit C1 is described with reference to a flowchart shown in FIG. 2. As shown in FIG. 2, the wavelength-lock control unit C1 applies an initial AC voltage corresponding to a wavelength to be locked to the phase adjustment element 17 and the variable wavelength reflector 18 based on the relation between the wavelength and the applied AC voltage for each of the phase adjustment element 17 and the variable wavelength reflector 18 (Step S101).

The intensity PD2 from the photodetecting element 32 is monitored, and phase adjustment processing for adjusting AC voltage to be applied to the phase adjustment element 17 is performed so that the intensity PD2 is maximized (Step S102). In other words, a resonance phase condition is adjusted. The detected-light intensities PD1 and PD2 from the photodetecting element 32 are monitored, and a wavelength adjustment for adjusting the AC voltage to be applied to the variable wavelength reflector 18 is performed so that the value of PD2/PD1 is maximized (Step S103). In other words, a resonance amplitude condition is adjusted. In this case, an adjustment is performed so that a reflected light from the variable wavelength reflector 18 is maximized.

Process control then returns to Step S102, and processing at Steps S102 and S103 are repeated to continuously perform a wavelength-lock control to lock a wavelength at a desired resonance wavelength.

Figure 3:
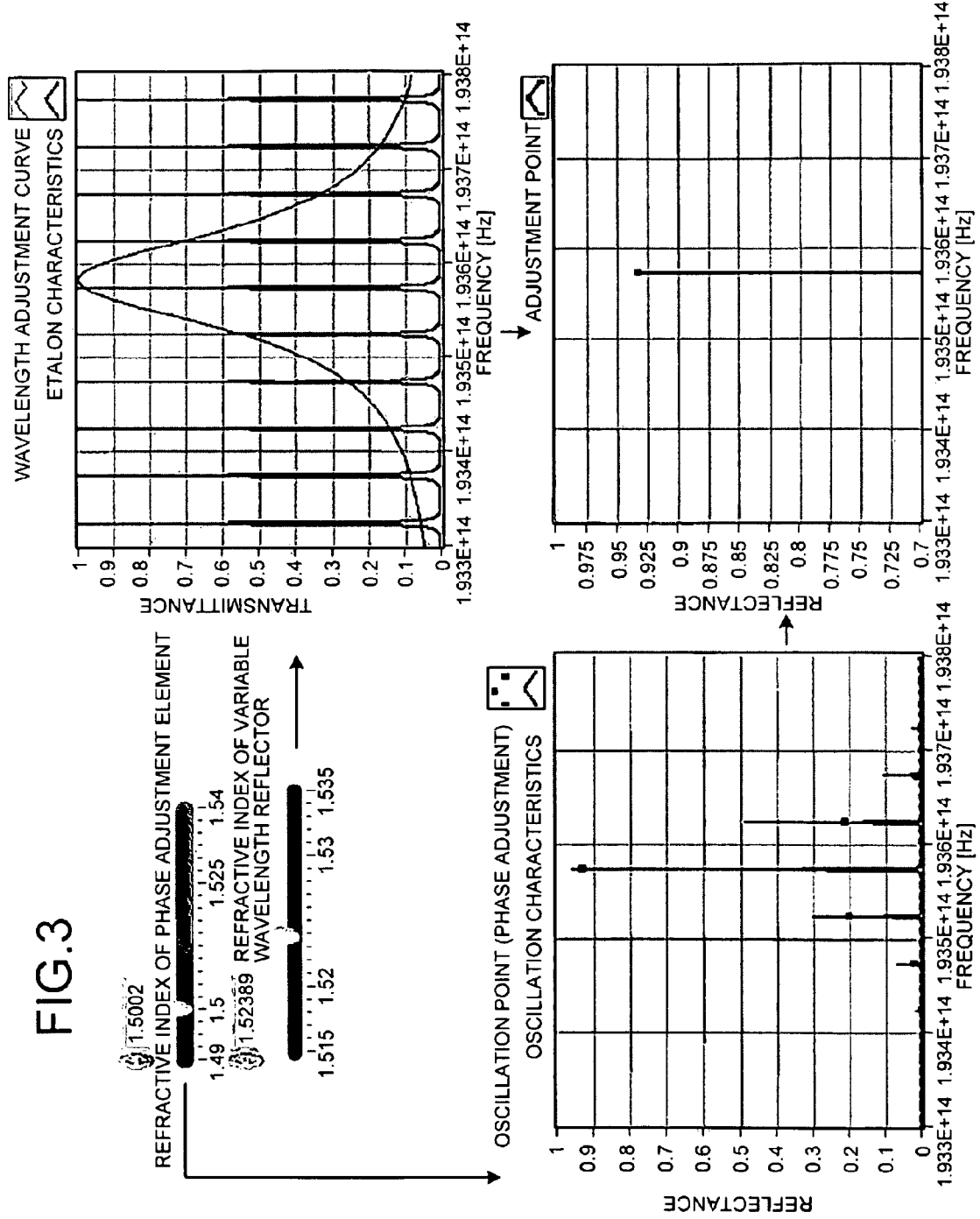
FIG. 3 is a schematic diagram for explaining an exemplary initial setting state of a wavelength-lock control.

The wavelength-lock control is described in detail with reference to FIGS. 3 to 7. Although the horizontal axes of the graphs shown in FIGS. 3 to 7 represent the frequency, because the wavelength and the frequency show one-to-one relationship, the graphs are equivalent to those described with the wavelength on the horizontal axes. FIG. 3 is a schematic diagram for explaining an exemplary initial setting state at Step S101 shown in FIG. 2. In the example shown in FIG. 3, a refractive index of the phase adjustment element 17 is initially set to 1.5002, while a refractive index of the variable wavelength reflector 18 is initially set to 1.52389. With this coarse adjustment, gain with reflectivity of about 0.9375 at frequency of 1.93575E+14 Hz is obtained.

Figure 4:
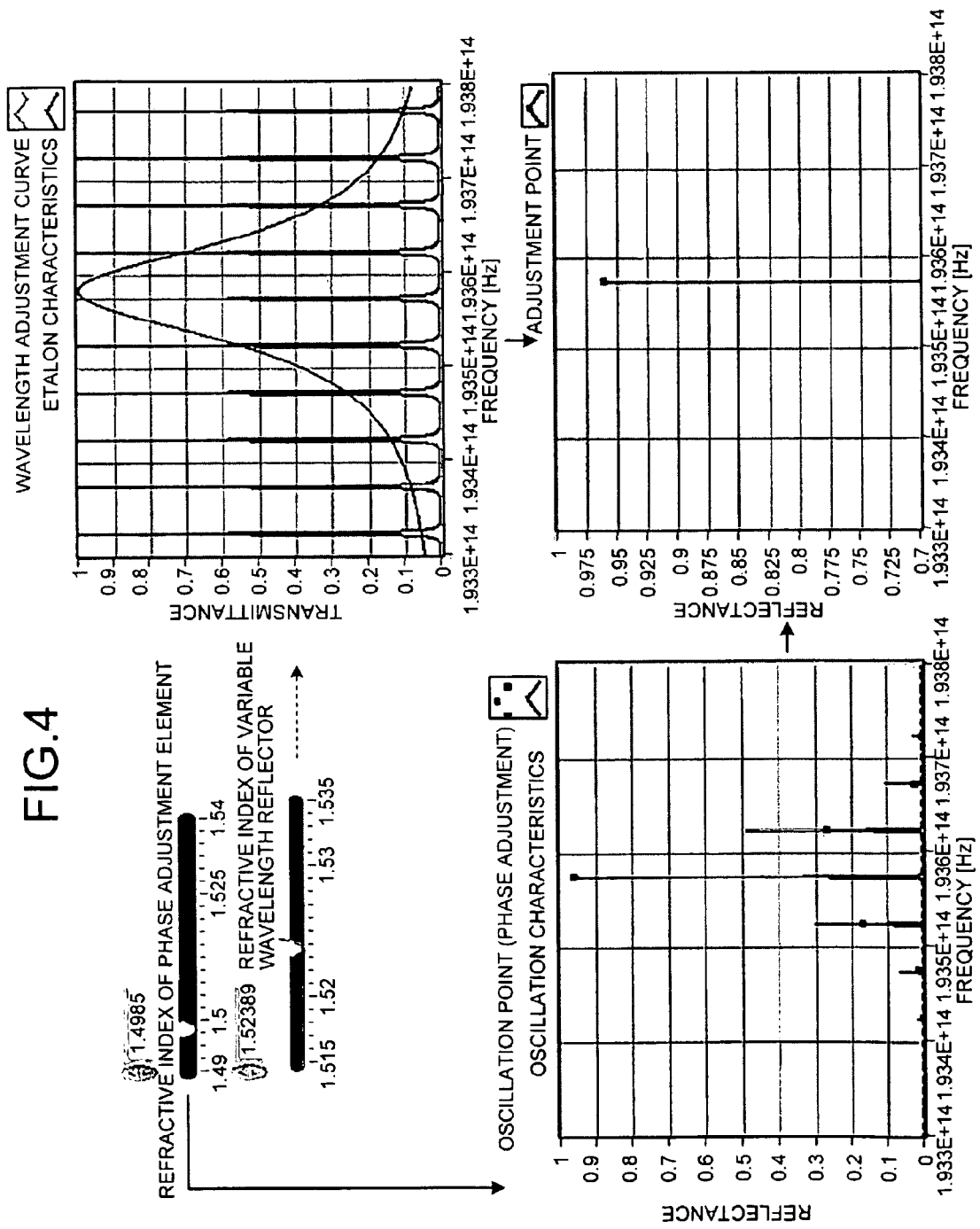
FIG. 4 is a schematic diagram for explaining an exemplary phase adjustment control in a wavelength-lock control.

In the processing at Step S102, as shown in FIG. 4, the intensity PD2 is monitored and the refractive index of the phase adjustment element 17 is adjusted so that the intensity PD2 is maximized. In the example shown in FIG. 4, the refractive index of the phase adjustment element 17 is changed from 1.5002 to 1.4985. With this adjustment, a phase condition of the resonance wavelength becomes more optimal, resulting in gain with increased reflectivity of about 0.9625.

Figure 5:
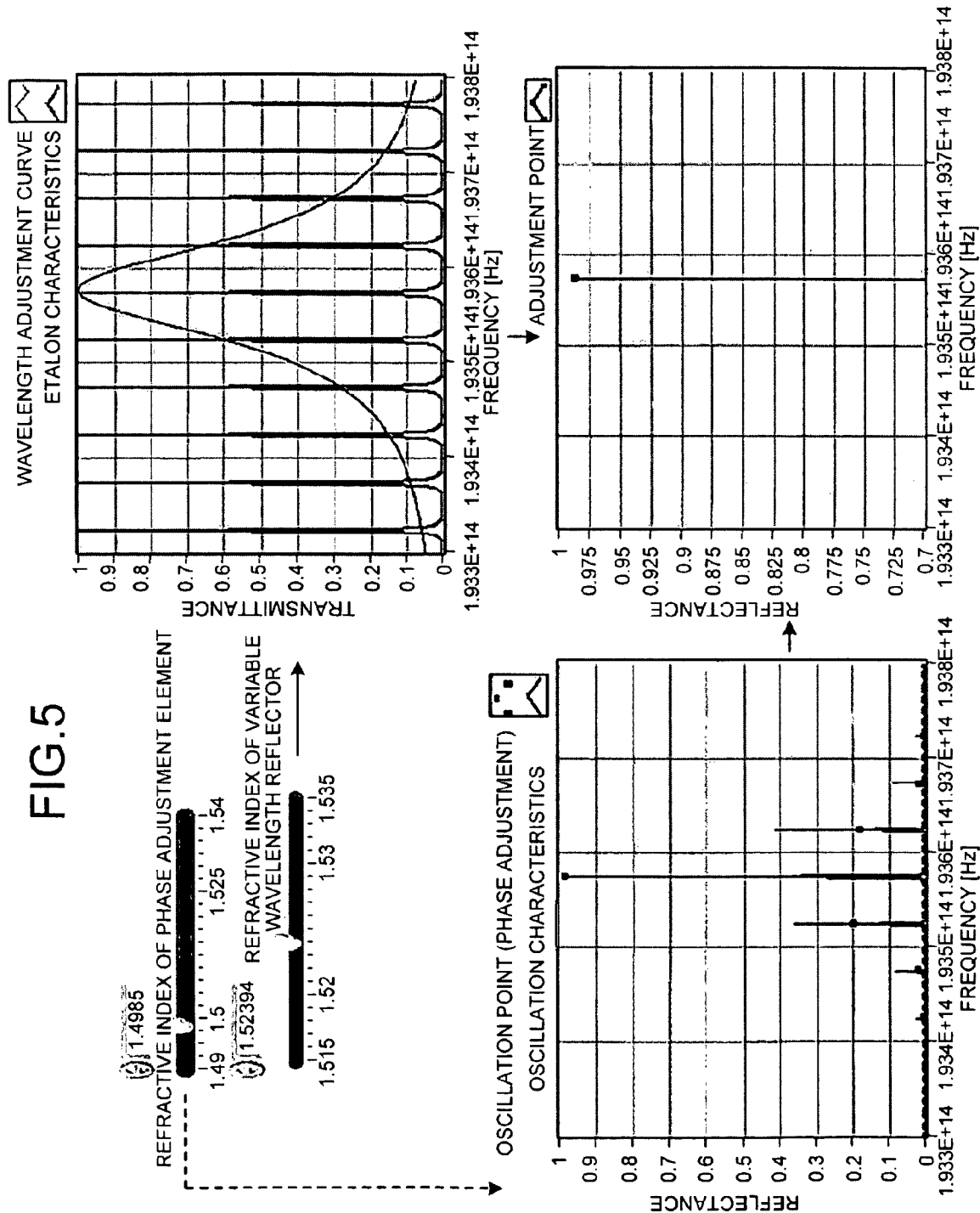
FIG. 5 is a schematic diagram for explaining an exemplary wavelength adjustment control in a wavelength-lock control.

In the processing at Step S103, as shown in FIG. 5, the detected-light intensities PD1 and PD2 are monitored, and the refractive index of the variable wavelength reflector 18 is adjusted so that the value of PD2/PD1 is maximized. In this case, the refractive index of the variable wavelength reflector 18 is changed from 1.52389 to 1.52394. In other words, an adjustment is performed so that a peak of wavelength adjustment curve matches a peak of etalon characteristics in a graph shown on a top right of FIG. 5. As a result, an amplitude condition of the resonance wavelength becomes more optimal, resulting in gain with increased reflectivity of about 0.9875.

Figure 6:
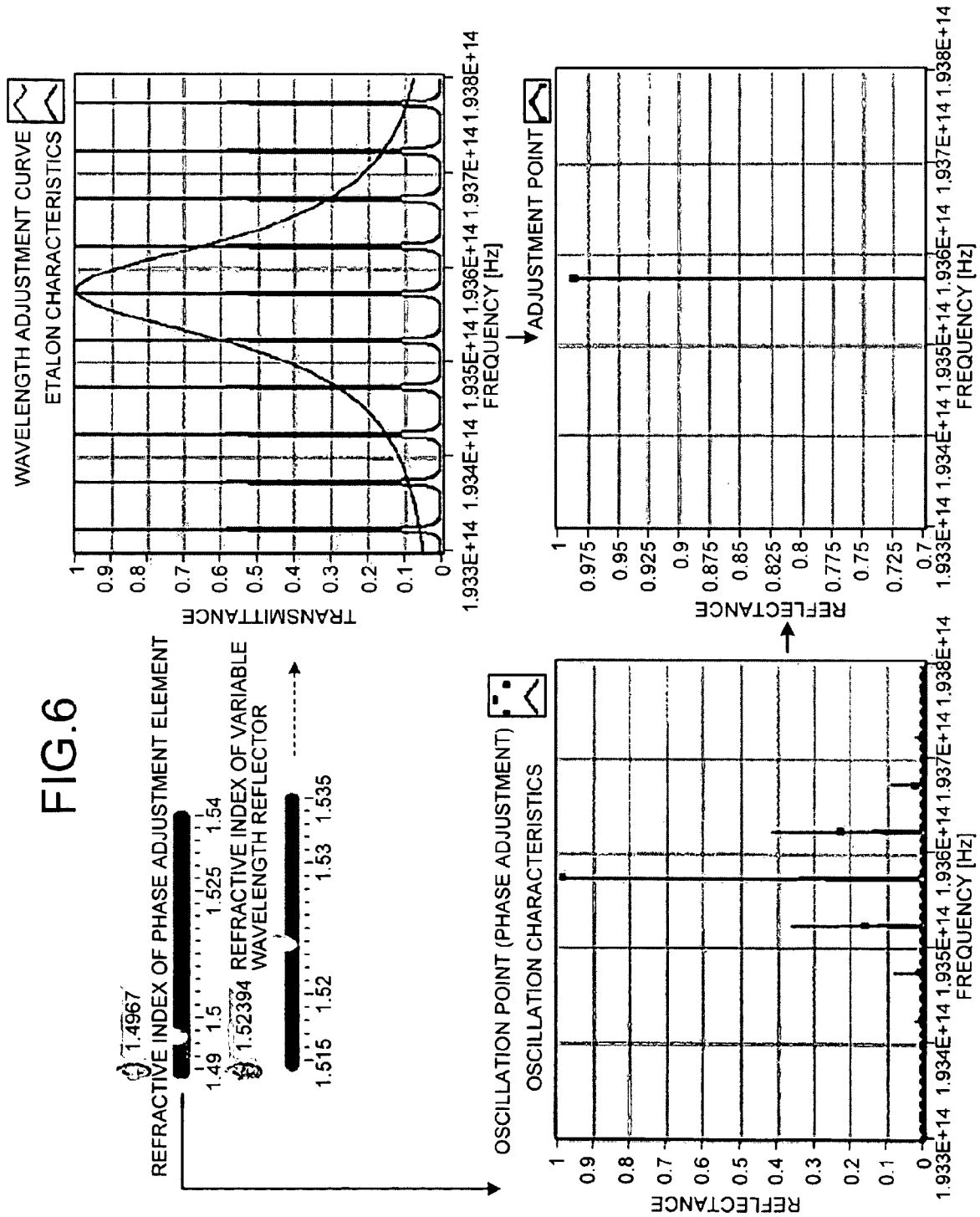
FIG. 6 is a schematic diagram for explaining an exemplary phase adjustment control re-performed in a wavelength-lock control.

FIG. 6 is a schematic diagram for explaining a state where the processing at Step S102 is re-performed in a state shown in FIG. 5. Specifically, the refractive index of the phase adjustment element 17 is changed from 1.4985 to 1.49967 due to a result of monitoring of the intensity PD1. As a result, the phase condition of the resonance wavelength becomes more optimal, resulting in gain with maintained reflectivity of about 0.988 or more.

Figure 7:
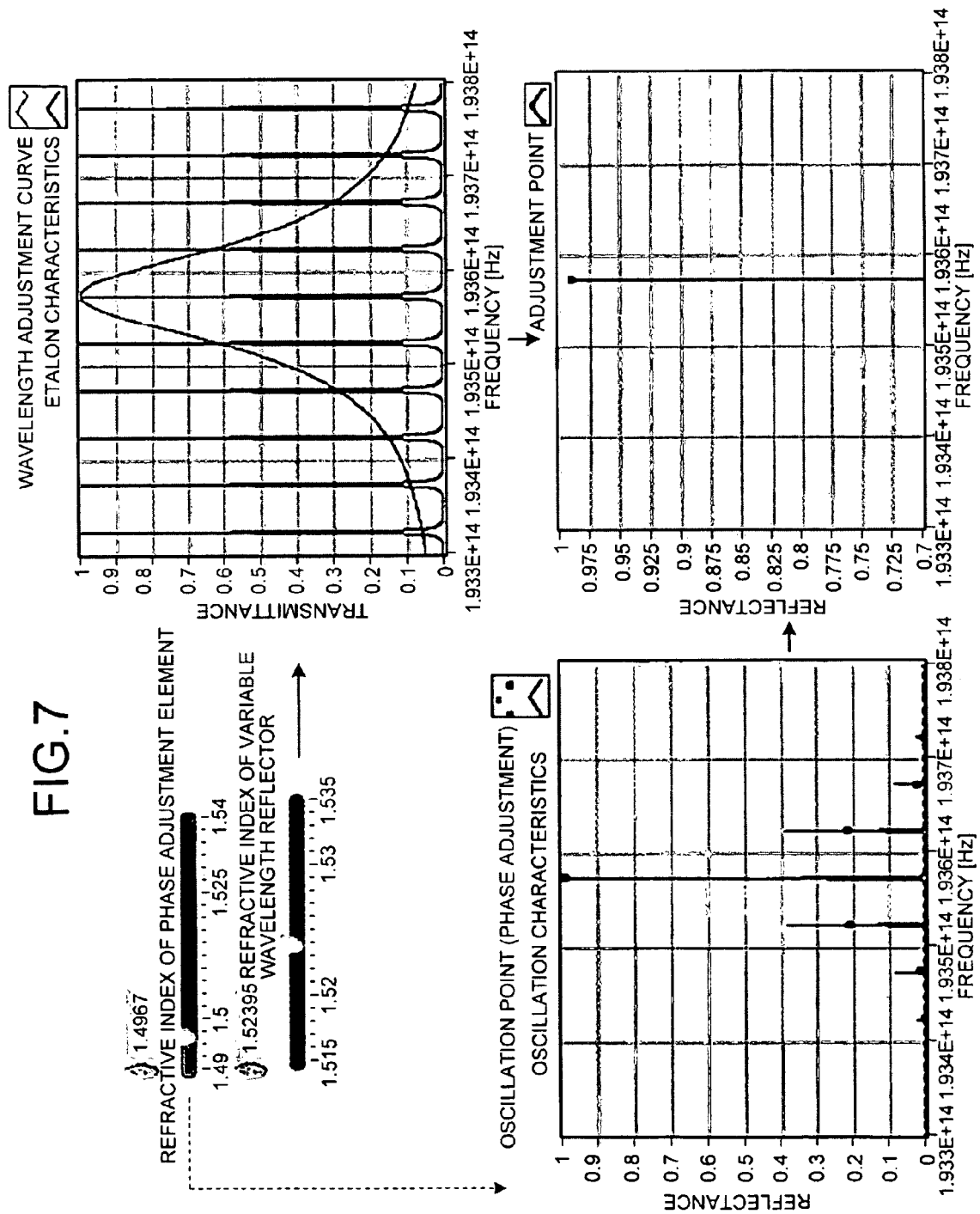
FIG. 7 is a schematic diagram for explaining an exemplary wavelength adjustment control re-performed in a wavelength-lock control.

FIG. 7 is a schematic diagram for explaining a state in which the processing at Step S103 is re-performed under a condition described in connection with FIG. 6. Specifically, the refractive index of the variable wavelength reflector 18 is changed from 1.52394 to 1.52395 due to a result of monitoring of the detected-light intensities PD1 and PD2. As a result, an amplitude condition of the resonance wavelength becomes more optimal, resulting in gain with increased reflectivity of about 0.99. With this condition, the resonance wavelength is substantially locked.

According to the first embodiment, the phase adjustment element 17 is installed in the laser resonator 20 including the gain element 12 and the variable wavelength reflector 18, and the amplitude condition and the phase condition are adjusted by the variable wavelength reflector 18 and the phase adjustment element 17 in a manner independent from the power control performed on the gain element 12. Therefore, it is possible to perform a wavelength-lock control with high precision in a manner independent from the power control.

Second Embodiment

A second embodiment of the present invention is described below. According to the second embodiment, an arrangement in the laser resonator 20 is determined so that the phase adjustment element 17 can easily perform a phase adjustment.

Figure 8:
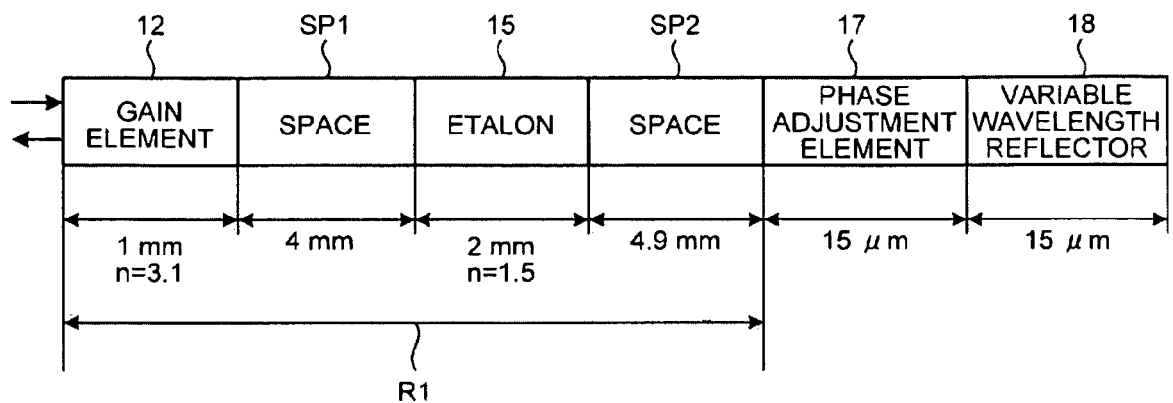
FIG. 8 is a schematic diagram of an arrangement in a laser resonator of a variable wavelength light source according to a second embodiment of the present invention.

FIG. 8 is a schematic diagram of an arrangement in a laser resonator of a variable wavelength light source according to the second embodiment. As shown in FIG. 8, the gain element 12, a space SP1 between the gain element 12 and the etalon 15, the etalon 15, and a space SP2 between the etalon 15 and the phase adjustment element 17 are arranged so that a total value of each of the optical path lengths matches an integral multiple of the optical path length of the etalon 15.

Assuming that the total value matches the integral multiple of the optical path length of the etalon 15 by adjusting a physical length of the space SP2. As shown in FIG. 8, the physical length of the etalon 15 is 2 mm and its refractive index is 1.5; therefore, its optical path length is 3 mm. On the other hand, the physical length of the gain element 12 is 1 mm and its refractive index is 3.1; therefore, its optical path length is 3.1 mm. Similarly, the physical length of the space SP1 is 4 mm and its refractive index is 1; therefore, its optical path length is 4 mm. At this state, the total value of the optical path lengths of the gain element 12, the space SP1, and the etalon 15 becomes 10.1 mm. The optical path length of the etalon 15 is 3 mm, so that its integral multiple includes 12 mm, 15 mm, and the like. In the example shown in FIG. 8, the optical path length, i.e., the physical length, of the space SP2 is set at 4.9 mm so that the total optical path length becomes 15 mm. It is explained that the total optical path length of the gain element 12, the space SP1, the etalon 15, and the space SP2 matches the integral multiple of the optical path length of the etalon 15; however, even if the total optical path length excluding the optical path length of the etalon 15 is considered as the total optical path length, the same calculation is applicable.

By setting the optical path length in the above manner, only the number of standing wave is changed in the resonator including a reflection mirror, so that a large degree of geometry variation can be suppressed. Thus, the phase adjustment for the phase adjustment element 17 can be easily performed. In other words, by performing an initial phase adjustment for the phase adjustment element 17, when changing the wavelength, it is possible to attain a state where the phase condition is matched without causing a large degree of change in the phase adjustment.

Figure 9:
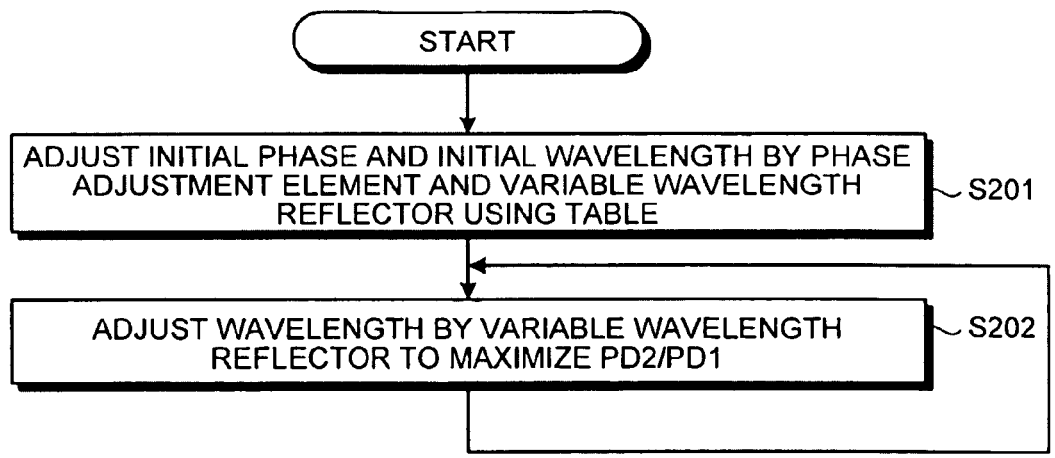
FIG. 9 is a flowchart of a wavelength-lock control process performed by a wavelength-lock control unit of the variable wavelength light source shown in FIG. 8.

FIG. 9 is a flowchart of a wavelength-lock control process performed by a wavelength-lock control unit according to the second embodiment. As shown in FIG. 9, the wavelength-lock control unit C1 applies an initial AC voltage of a wavelength to be locked to the phase adjustment element 17 and the variable wavelength reflector 18 based on the relation between the wavelength and the applied AC voltage of each of the phase adjustment element 17 and the variable wavelength reflector 18 stored in the table 35 (Step S201).

The intensity PD1 from the photodetecting element 31 and the intensity PD2 from the photodetecting element 32 are monitored, and a wavelength adjustment for adjusting the AC voltage to be applied to the variable wavelength reflector 18 is performed so that the value of PD2/PD1 is maximized (Step S202). Then, the wavelength adjustment processing at Step S202 is repeated. In this case, the phase adjustment processing for adjusting the AC voltage to be applied to the phase adjustment element 17 to maximize the intensity PD1 is not performed. It is because the phase condition is substantially adjusted by the phase adjustment processing at Step S201.

An example of the wavelength-lock control according to the second embodiment is described with reference to FIGS. 10 to 12. In the example shown in FIG. 10, as for the phase adjustment by the phase adjustment element 17, the phase condition is in the locked state with the refractive index of 1.4967 as described in connection with FIG. 7. Therefore, to attain the above condition, the refractive index of the phase adjustment element 17 is set to 1.4967 through the initial phase adjustment.

The detected-light intensities PD1 and PD2 are monitored, and the wavelength adjustment of the variable wavelength reflector 18 is repeated until the value of PD2/PD1 is maximized, so that the refractive index is set to 1.52597. As a result, gain with reflectivity of about 0.98 at the frequency of 1.93324985E+14 Hz is obtained, resulting in attaining the wavelength locked state.

Figure 10:
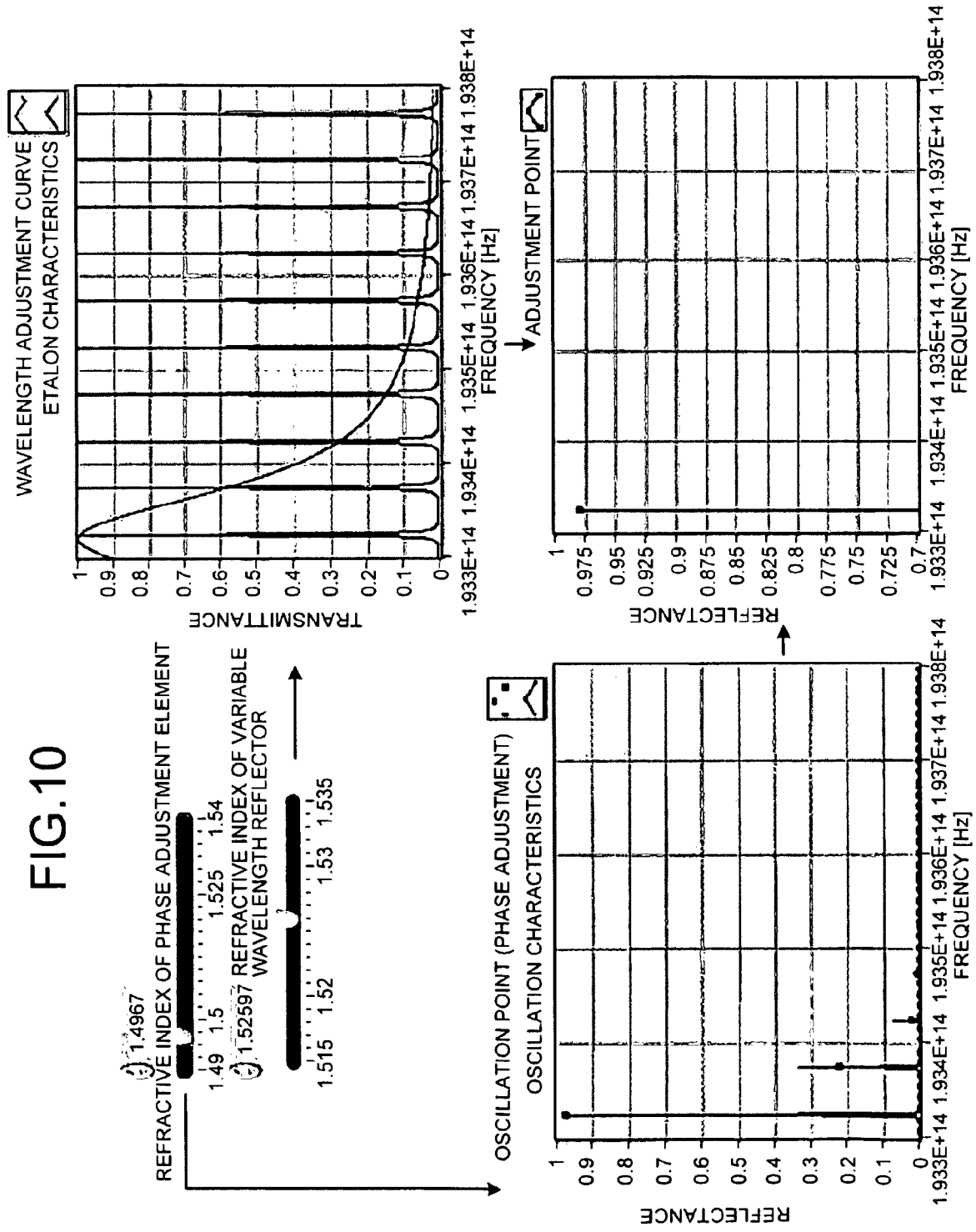
FIG. 10 is a schematic diagram for explaining an exemplary wavelength-lock control according to the second embodiment.
Figure 11:
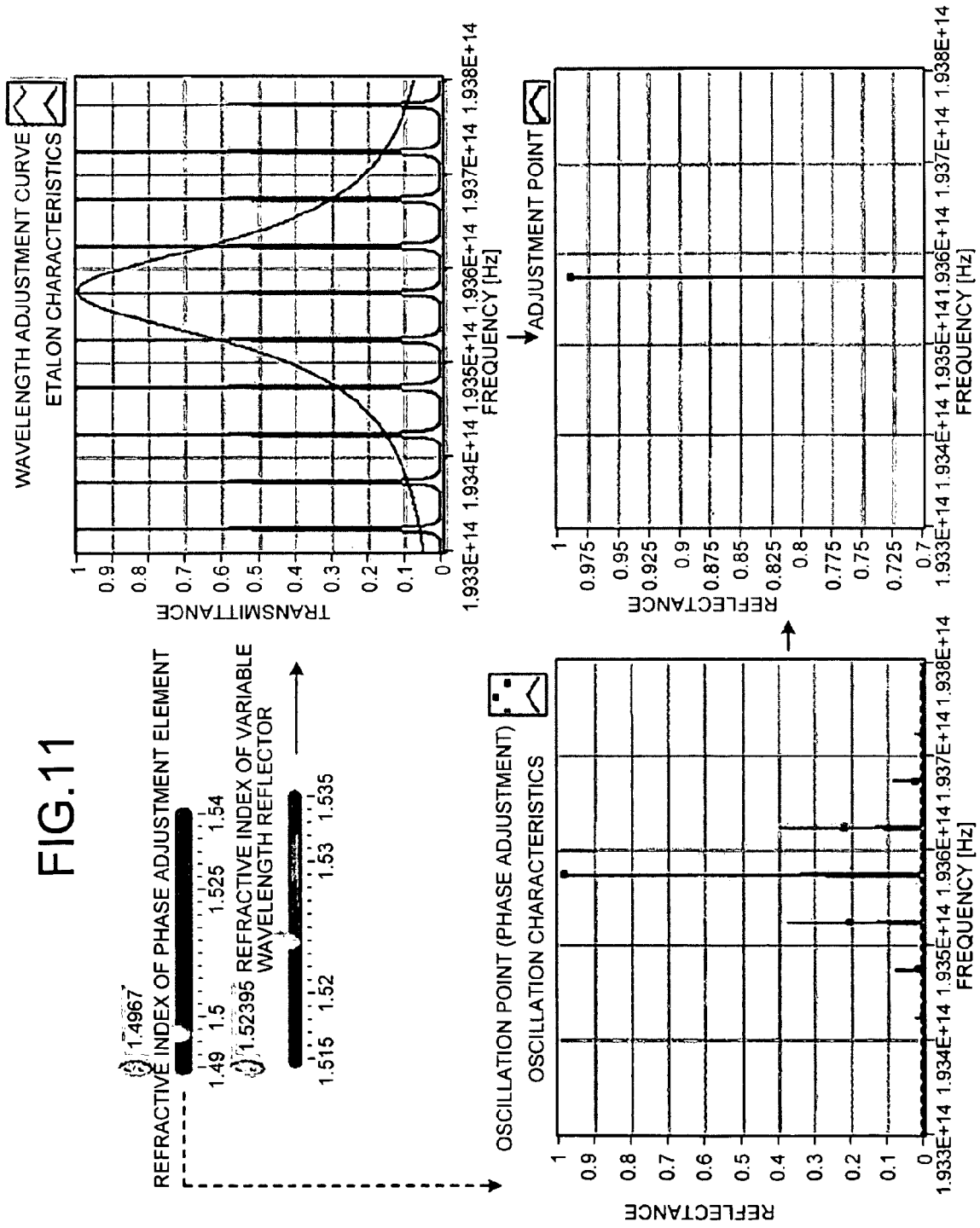
FIG. 11 is a schematic diagram for explaining an exemplary wavelength-lock control according to the second embodiment.

As shown in FIG. 11, when the wavelength is locked from the wavelength locked state shown in FIG. 10 to the wavelength with frequency of 1.93574988E+14 Hz, the phase adjustment for the phase adjustment element 17 is maintained at a set refractive index of 1.4967, and the wavelength adjustment of the variable wavelength reflector 18 is repeated until the refractive index becomes 1.52395. As a result, gain with reflectivity of about 0.99 is attained, attaining the wavelength locked state.

Figure 12:
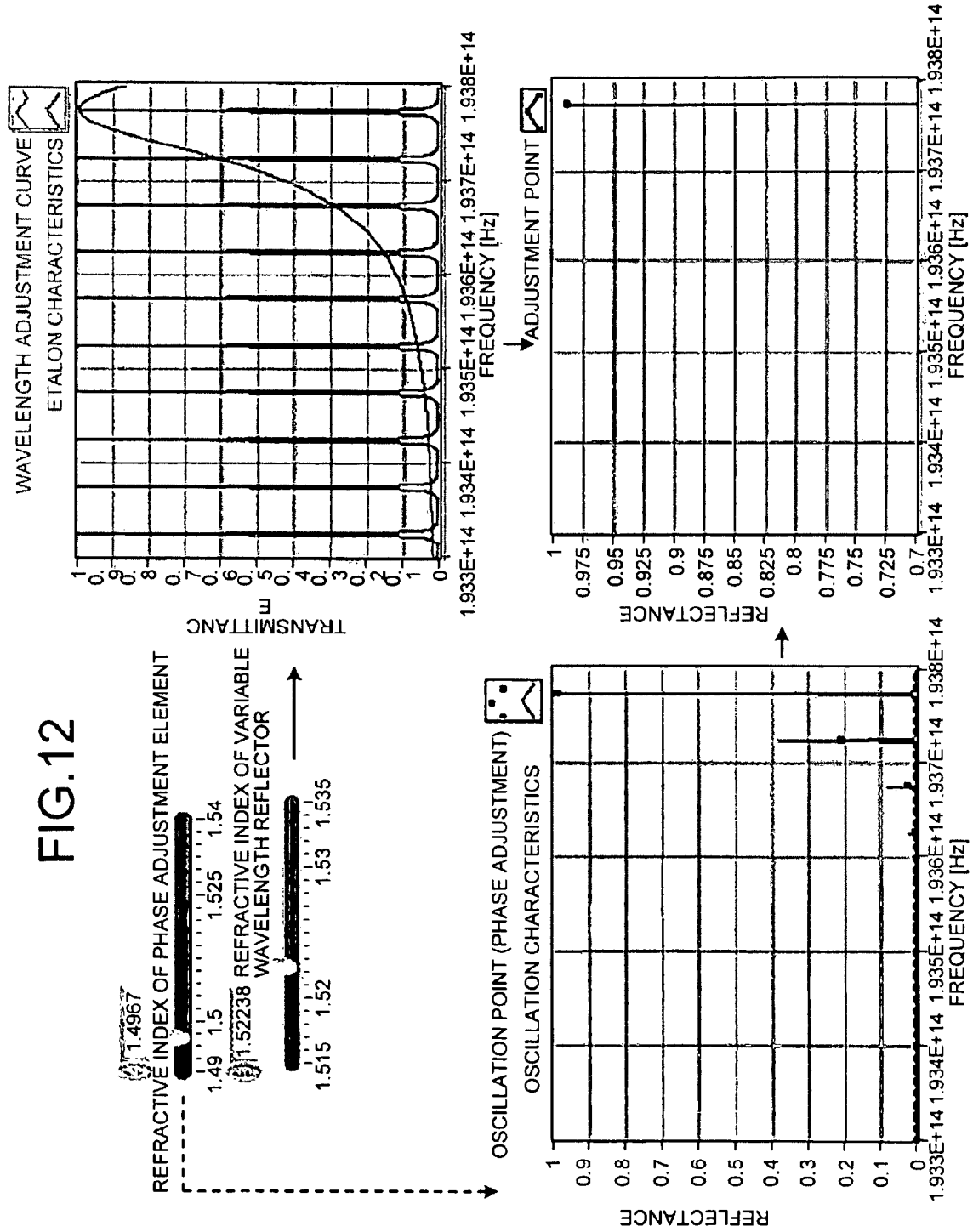
FIG. 12 is a schematic diagram for explaining an exemplary wavelength-lock control according to the second embodiment.

Similarly, as shown in FIG. 12, when the wavelength is locked from the wavelength locked state shown in FIG. 11 to the wavelength at frequency of 1.93775E+14 Hz, the phase adjustment for the phase adjustment element 17 is maintained at a set refractive index of 1.4967, and the wavelength adjustment of the variable wavelength reflector 18 is repeated until the refractive index becomes 1.52238. As a result, gain with reflectivity of about 0.99 is attained, attaining the wavelength locked state.

According to the second embodiment, the spaces SP1 and SP2 are previously arranged so that the phase condition in the laser resonator 20 is not changed by adjustment by the phase adjustment element 17. Therefore, initial phase adjustment is only necessary as the phase adjustment for the phase adjustment element 17, and it is possible to lock a wavelength at the desired resonance wavelength only by performing the wavelength adjustment by the variable wavelength reflector 18.

Figure 13:
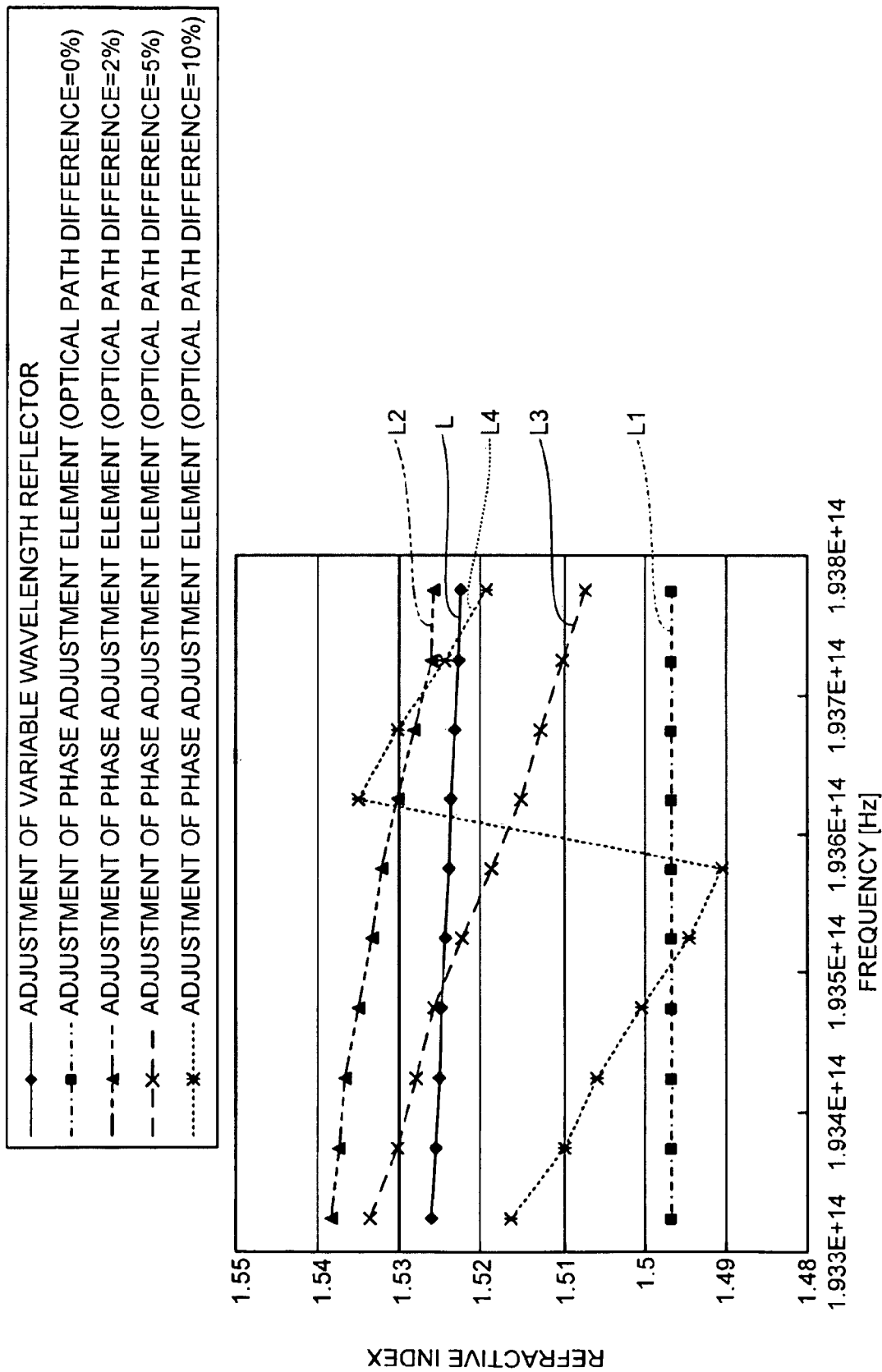
FIG. 13 is a graph of variation in a refractive index of a variable wavelength reflector and a phase adjustment element using a value of an optical path length as a parameter with respect to variation in a resonance wavelength (frequency)

FIG. 13 is a graph of variation in refractive index against the frequency (wavelength) at the time of wavelength-lock control. Plots on each of curved lines L, L1 to L4 represent channels to be a target of a wavelength-lock. In the example shown in FIG. 13, ten channels of the wavelength-lock are plotted.

The curved line L1 represents variation in a refractive index of the phase adjustment element 17 when the spaces SP1 and SP2 are set in the optical length described in the second embodiment, i.e., when the optical path difference is zero. The curved line L1 is maintained at a constant refractive index of 1.4967. The curved line L represents variation in the refractive index with respect to variation in the frequency (wavelength) of the variable wavelength reflector 18. It can be seen that slight variation in the refractive index occurs with respect to the variation in the frequency (wavelength).

The curved lines L2 to L4 represent variation in the refractive index with respect to the variation in the frequency with optical path difference of 2%, 5%, 10%, respectively. If the optical path difference is present, the amount of variation in the refractive index of the phase adjustment element 17 with respect to the variation in the frequency increases. In an actual variable wavelength range, ninety-five channels are set at an interval of 50 GHz in C-band. Therefore, if the amount of variation in the refractive index with respect to the variation in the frequency increases, the wavelength-lock control becomes complicated. On the other hand, as described in the second embodiment, by previously adjusting the phase condition in most of the regions in the laser resonator 20 only by the phase adjustment element 17, it is possible to perform the wavelength-lock with high precision in a simple manner by performing the wavelength-lock control for the variable wavelength reflector 18 without performing the phase adjustment for the phase adjustment element 17.

When the optical path difference is small, for example, the difference is about 2%, the amount of variation in the refractive index with respect to the variation in the frequency is also small. Therefore, it is possible to perform the wavelength-lock control in a linear manner in the entire C-band. Thus, the wavelength-lock control including the phase adjustment for the phase adjustment element 17 can be easily performed.

(First Modification)

Figure 14:
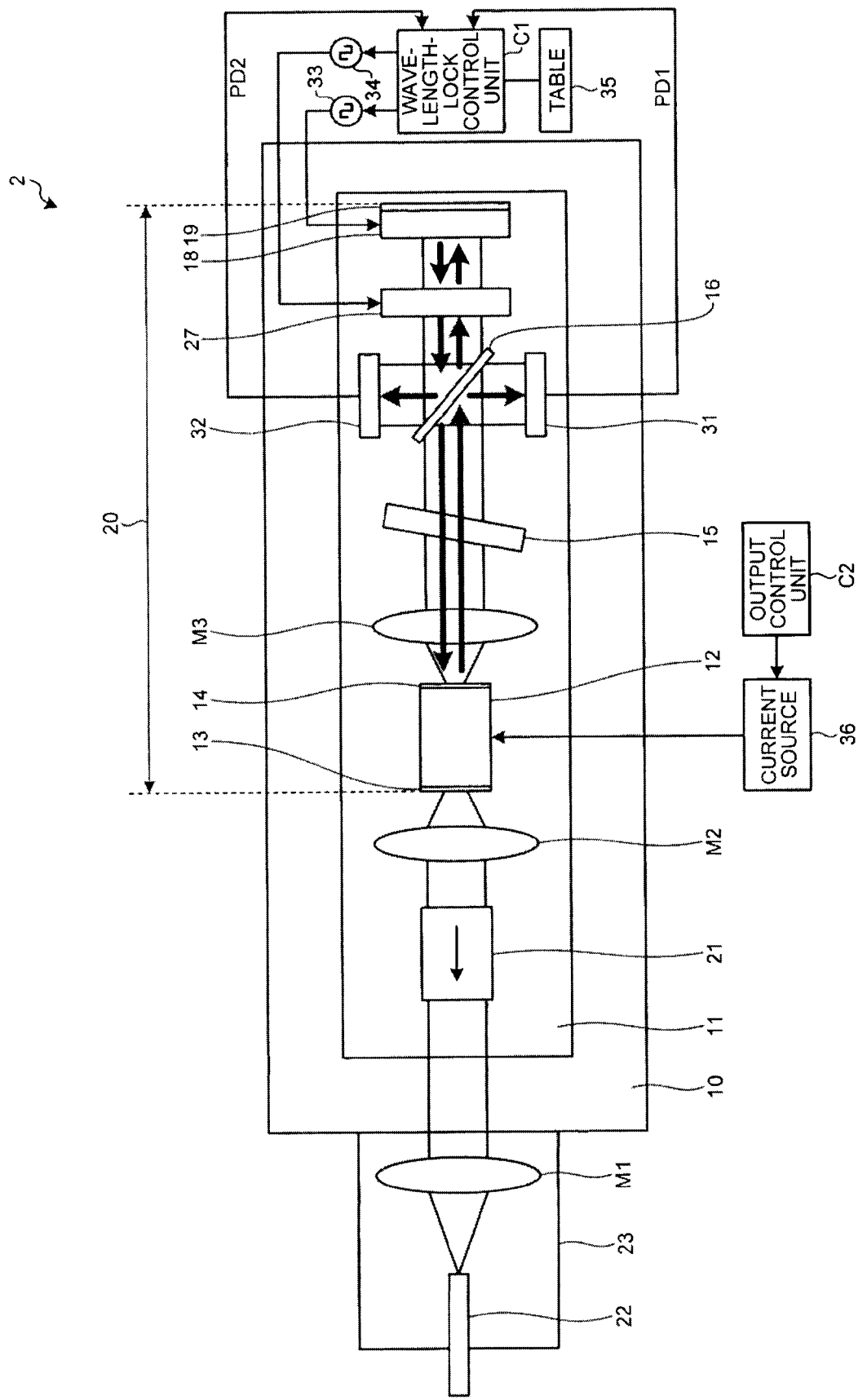
FIG. 14 is a schematic diagram of a first modification of the first and the second embodiments.

Modifications of the first and the second embodiments are described below. FIG. 14 is a schematic diagram of a first modification of the first and the second embodiments. A variable wavelength light source 2 according to the first modification has a configuration in which a phase adjustment element 27 is separated from the variable wavelength reflector 18. With the first modification, it is possible to attain the same effect as that described in the first and the second embodiments.

(Second Modification)

Figure 15:
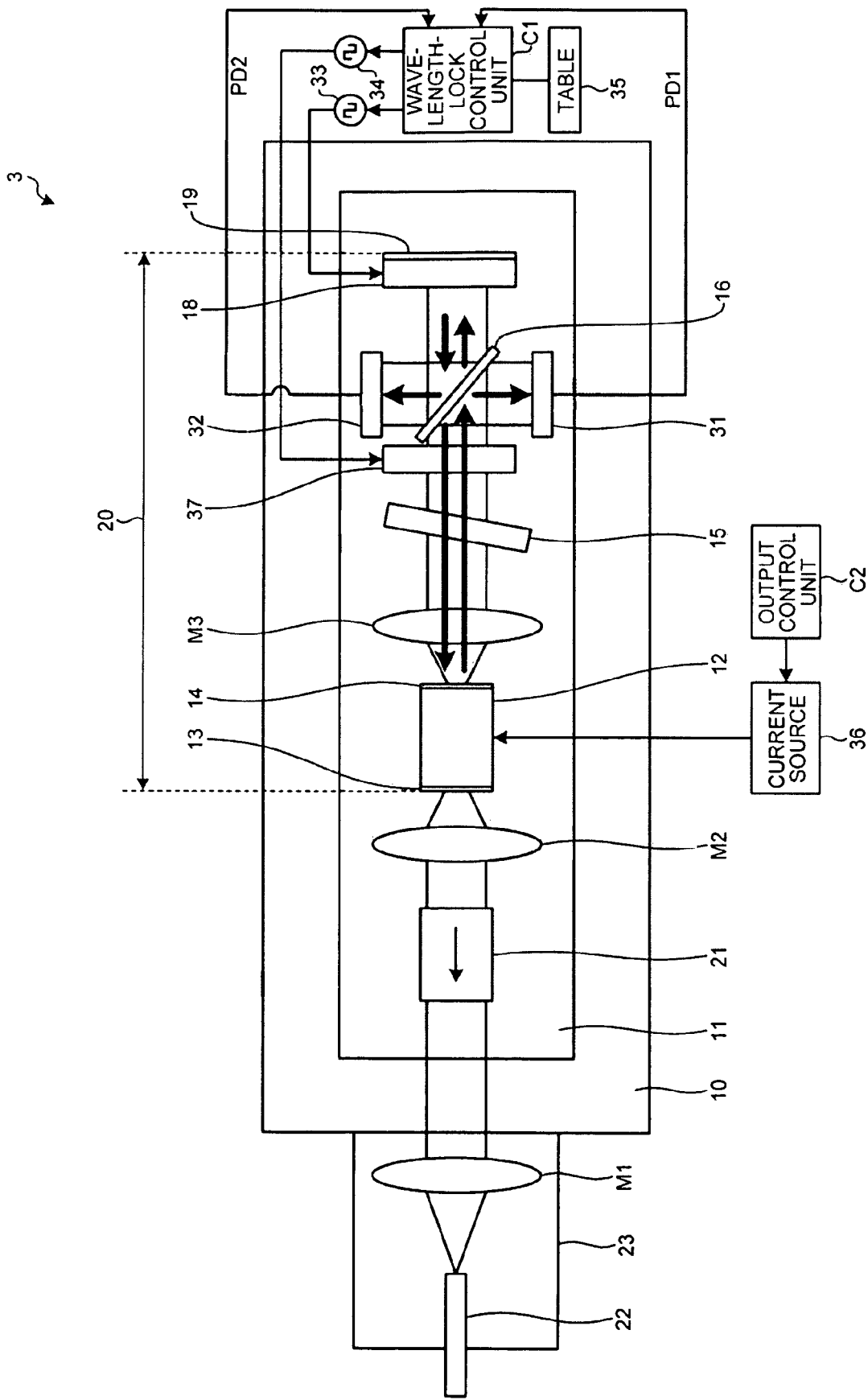
FIG. 15 is a schematic diagram of a second modification of the first and the second embodiments.

FIG. 15 is a schematic diagram of a second modification of the first and the second embodiments. In a variable wavelength light source 3 according to the second modification, a phase adjustment element 37 is arranged between the etalon 15 and the beam splitter 16. Other configurations are the same as that of the first embodiment. With the second modification, it is possible to attain the same effect as that described in the first and the second embodiments.

(Third Modification)

Figure 16:
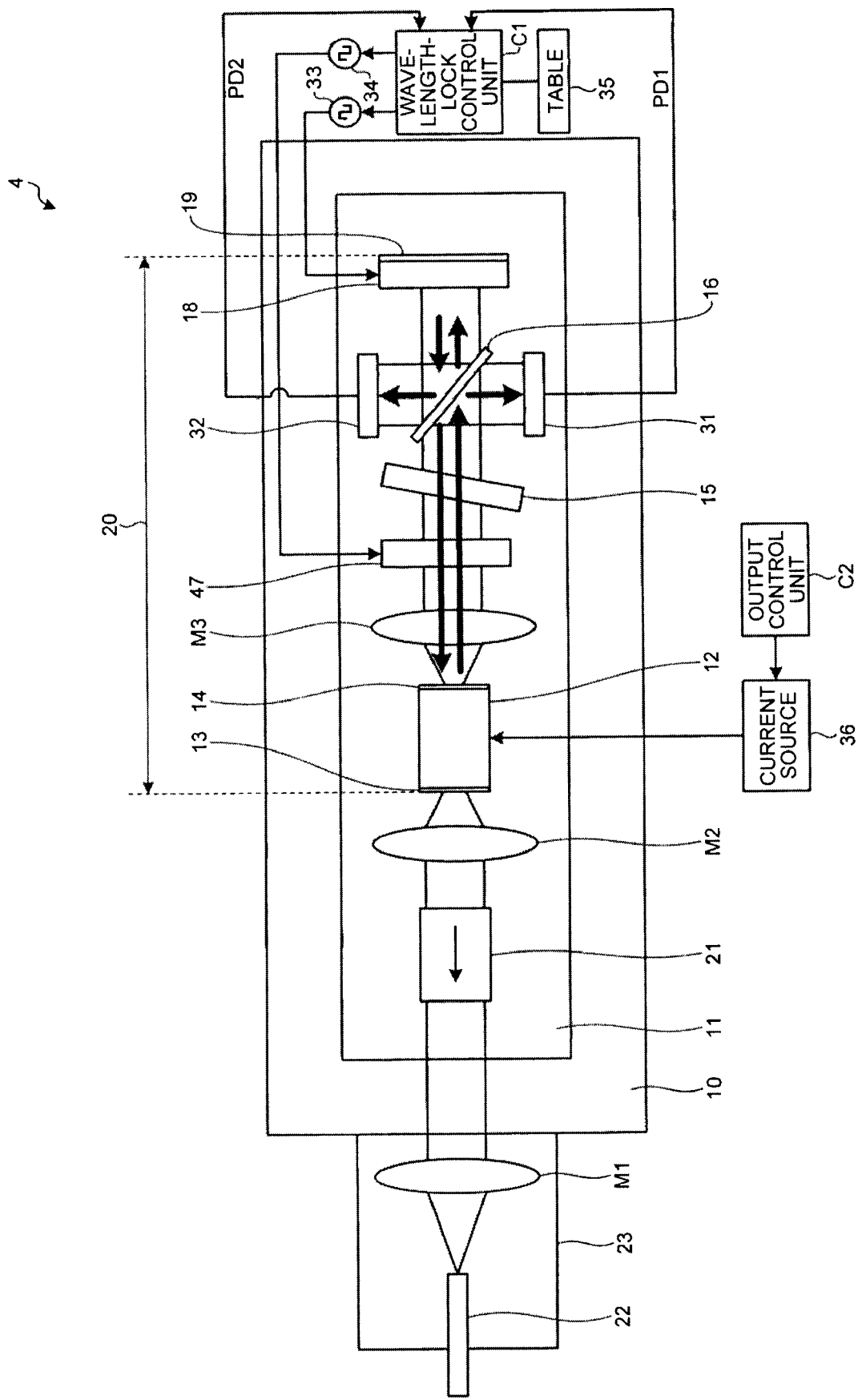
FIG. 16 is a schematic diagram of a third modification of the first and the second embodiments.

FIG. 16 is a schematic diagram of a third modification of the first and the second embodiments. In a variable wavelength light source 4 according to the third modification, a phase adjustment element 47 is arranged between a coupling lens M3 and the etalon 15. Other configurations are the same as that of the first embodiment. With the third modification, it is possible to attain the same effect as that described in the first and the second embodiments. It can be seen from the first to the third modifications that the phase adjustment element 17 can be arranged at any position within the laser resonator 20.

(Fourth Modification)

Figure 17:
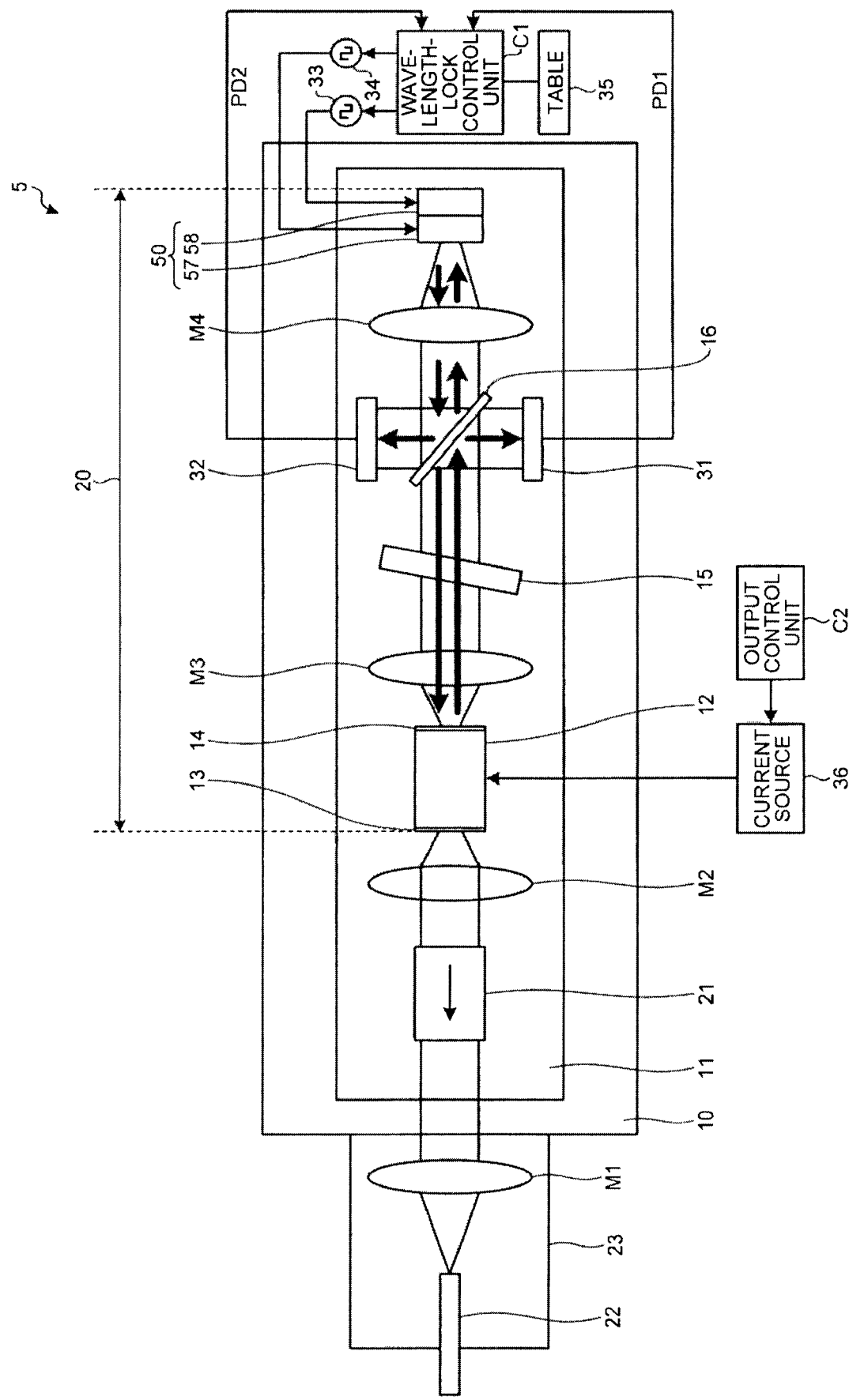
FIG. 17 is a schematic diagram of a fourth modification of the first and the second embodiments.

FIG. 17 is a schematic diagram of a fourth modification of the first and the second embodiments. A variable wavelength light source 5 according to the fourth modification includes a waveguide element 50 in which a phase adjustment element 57 corresponding to the phase adjustment element 17 is integrated with a variable wavelength reflector 58 corresponding to the variable wavelength reflector 18. The variable wavelength light source 5 also includes a collective lens M4 between the waveguide element 50 and the beam splitter 16 for inputting a laser light to the waveguide element 50. Other configurations are the same as that of the first embodiment. With the fourth modification, it is possible to attain the same effect as that described in the first and the second embodiments.

According to the fourth modification, due to the waveguide element 50, it is possible to apply a wavelength filter using a thermooptic effect instead of changing a refractive index by liquid crystal. Specifically, it is preferable to perform a filtering of a wavelength in such a manner that a refractive index is changed by changing temperature of a fine ring resonator having the thermooptic effect by using a microheater.

(Fifth Modification)

Figure 18:
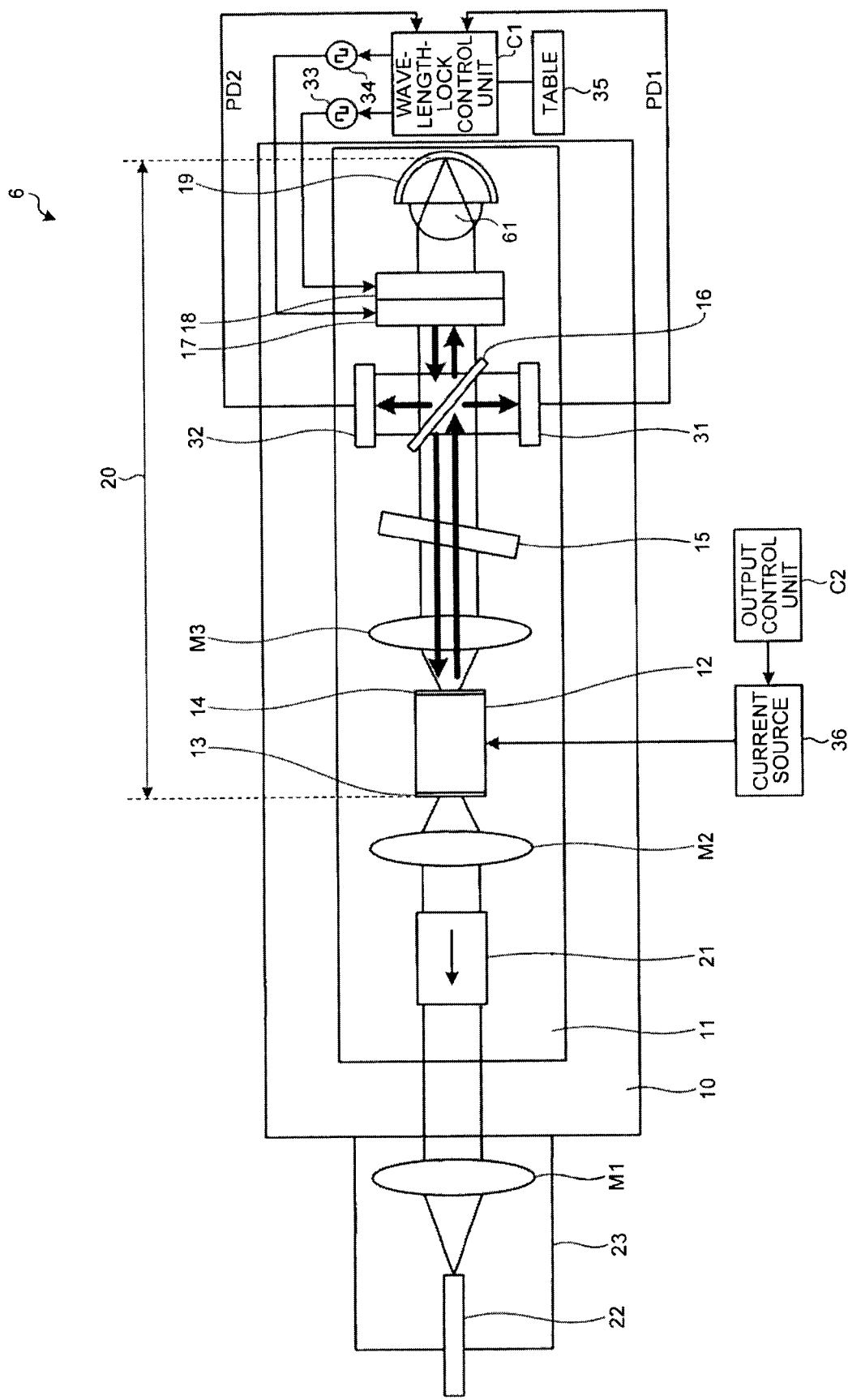
FIG. 18 is a schematic diagram of a fifth modification of the first and the second embodiments.

FIG. 18 is a schematic diagram of a fifth modification of the first and the second embodiments. A variable wavelength light source 6 according to the fifth embodiment has a configuration in which the variable wavelength reflector 18 is separated from the HR coating 19, and a retro reflector 61 called cat's-eye retro reflector that is a spherical reflection mirror having a different curvature radius for each of the front facet and the rear facet that has an HR filter. The retro reflector 61 reflects a light toward the same direction as the direction of the light applied from a variable wavelength filter 18. According to the fifth embodiment, a convex side of a hemispherical lens of the retro reflector 61 with a curvature radius of 1 mm faces the variable wavelength filter 18, and the HR coating 19 is arranged on a convex side of the hemispherical lens of the retro reflector 61 with a curvature radius of 1.134 mm. The retro reflector 61 is made of glass with refractive index of 1.869. By arranging such a retro reflector, it is possible to easily form a resonator with less loss.

(Sixth Modification)

Figure 19:
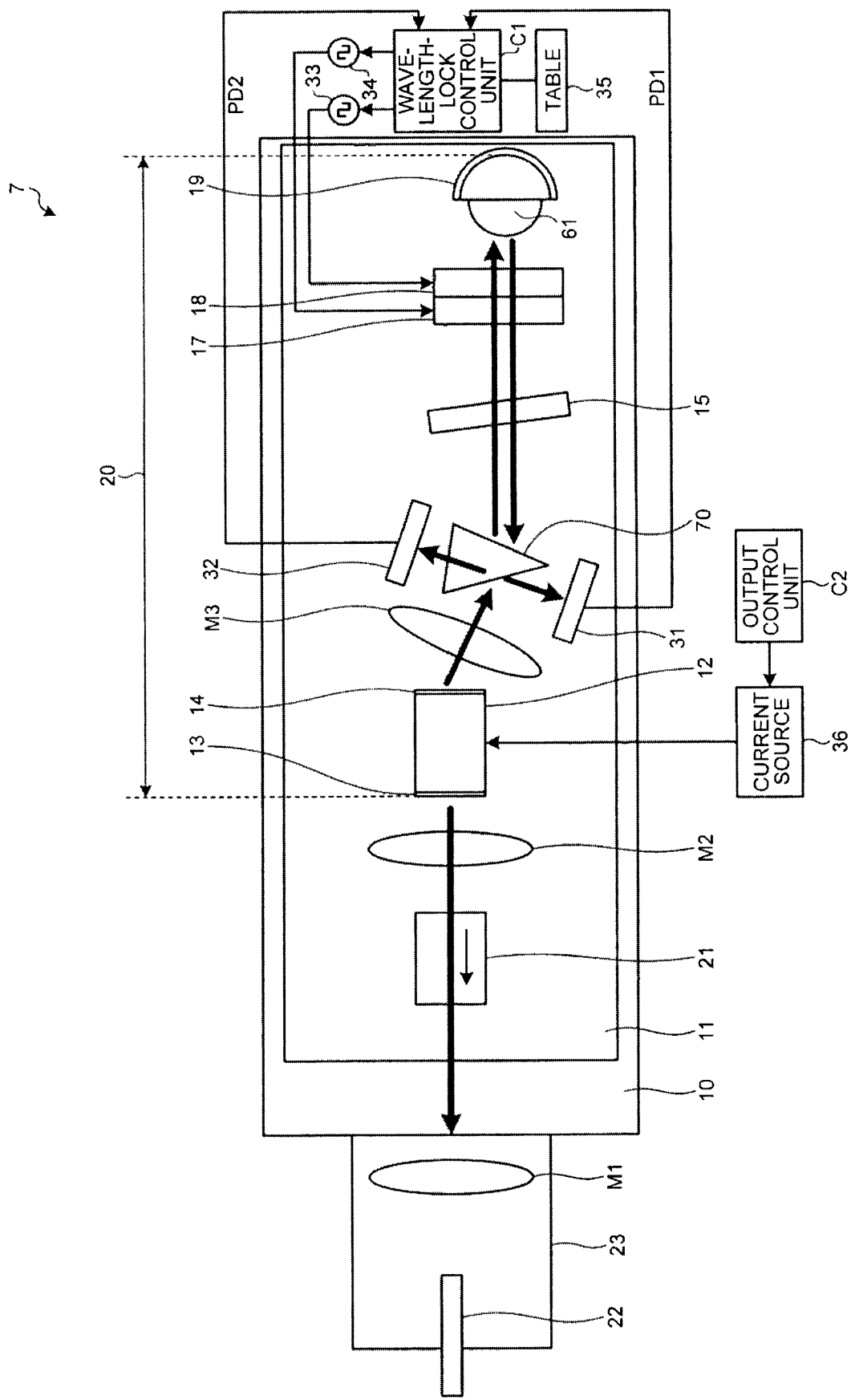
FIG. 19 is a schematic diagram of a sixth modification of the first and the second embodiments.

FIG. 19 is a schematic diagram of a sixth modification of the first and the second embodiments. A variable wavelength light source 7 according to the sixth embodiment includes a gain element, instead of the gain element 12, which includes an oblique output waveguide formed in such a manner that the rear facet of the output waveguide is obliquely arranged against a facet facing the AR coating 14. The light incidence angle to the facet of the output waveguide is about 7 degrees, while the light output angle from the facet is about 20 degrees because the light is output from the waveguide with a high refractive index toward air. The output light from the gain element 12 is condensed by the coupling lens M3, and converted into a parallel light via a prism 70. Therefore, it is possible to arrange constituent elements between the etalon 15 and the retro reflector 61 so that they are parallel to the output light. The prism 70 can be configured to function as a beam splitter. With this configuration, each of the optical elements can be compactly accommodated in the package 10. When the second embodiment is applied to the fifth and the sixth modifications, an adjustment is performed in consideration with variation in the optical path length by the retro reflector 61 and the prism 70.

The phase adjustment element and the variable wavelength reflector are not limited to those described above. Any elements that can perform the phase adjustment and the wavelength filtering are applicable. For example, an element in which fine grating and liquid crystal are combined can be used.

Further effect and modifications can be readily derived by persons skilled in the art. Therefore, a more extensive mode of the present invention is not limited by the specific details and the representative embodiment. Accordingly, various changes are possible without departing from the spirit or the scope of the general concept of the present invention defined by the attached claims and the equivalent.

What is claimed is:

1. A variable wavelength light source comprising:
   a gain element forming an output facet of a resonator;
   a variable wavelength reflector forming a reflection facet of the resonator for selecting a desired resonance wavelength by changing a resonance wavelength of the resonator;
   a wavelength selective element that selects the resonance wavelength, the wavelength selective element being arranged in the resonator formed between the output facet and the reflection facet;
   a beam splitter for monitoring an incident light from the gain element and a reflected light from the variable wavelength reflector, the beam splitter being arranged in the resonator;
   a phase adjustment element that is arranged in the resonator and changes a phase of the resonance wavelength; and
   a wavelength-lock control unit that locks the resonance wavelength to the desired resonance wavelength by adjusting the phase of the resonance wavelength by the phase adjustment element based on the incident light monitored by the beam splitter and by changing the resonance wavelength by adjusting the variable wavelength reflector based on a ratio between the incident light and the reflected light, wherein
   the wavelength selective element and the variable wavelength reflector are etalons,
   the phase adjustment element is an optical phase shifter in which liquid crystal is filled between optical glass plates having transparent electrodes,
   the variable wavelength reflector has liquid crystal filled in an etalon cavity, and
   the wavelength-lock control unit changes an effective refractive index of the liquid crystal by changing alternating-current voltage applied to the liquid crystal.

2. The variable wavelength light source according to claim 1, wherein the phase adjustment element is integrated with the variable wavelength reflector.

3. The variable wavelength light source according to claim 1, wherein the wavelength-lock control unit locks the resonance wavelength to the desired resonance wavelength by repeating a phase adjustment by the phase adjustment element and a wavelength adjustment by the variable wavelength reflector.

4. The variable wavelength light source according to claim 1, wherein the reflection facet side of the variable wavelength reflector has a retro reflector structure.

5. The variable wavelength light source according to claim 1, wherein the gain element includes an oblique output waveguide that obliquely outputs a light on the reflection facet side.

6. The variable wavelength light source according to claim 1 wherein
a total optical path of the gain element, a space between the gain element and the wavelength selective element, the wavelength selective element, and a space between the wavelength selective element and the variable wavelength reflector corresponds to an integral multiple of an optical path length of the wavelength selective element,
the phase adjustment element is adjusted to a predetermined value corresponding to the resonance wavelength, and
the wavelength-lock control unit locks the resonance wavelength to the desired resonance wavelength by exclusively adjusting the variable wavelength reflector based on the ratio between the incident light and the reflected light monitored by the beam splitter.

7. The variable wavelength light source according to claim 6, wherein the phase adjustment element is integrated with the variable wavelength reflector.

8. The variable wavelength light source according to claim 6, wherein
the wavelength selective element and the variable wavelength reflector are etalons,
the phase adjustment element is an optical phase shifter in which liquid crystal is filled between optical glass plates having transparent electrodes,
the variable wavelength reflector has liquid crystal filled in an etalon cavity, and
the wavelength-lock control unit changes an effective refractive index of the liquid crystal by changing alternating-current voltage applied to the liquid crystal.

9. The variable wavelength light source according to claim 6, wherein the reflection facet side of the variable wavelength reflector has a retro reflector structure.

10. The variable wavelength light source according to claim 6, wherein the gain element includes an oblique output waveguide that obliquely outputs a light on the reflection facet side.

* * * * *